(12) United States Patent
Park et al.

(10) Patent No.: US 8,486,812 B2
(45) Date of Patent: Jul. 16, 2013

(54) FABRICATION METHOD FOR POLYCRYSTALLINE SILICON THIN FILM AND DISPLAY DEVICE FABRICATED USING THE SAME

(75) Inventors: Ji-Yong Park, Suwon-si (KR); Hye-Hyang Park, Suwon-si (KR)

(73) Assignee: Samsung Display Co., Ltd., Yongin (KR)

( * ) Notice: Subject to any disclaimer, the term of this patent is extended or adjusted under 35 U.S.C. 154(b) by 1038 days.

(21) Appl. No.: 10/961,266

(22) Filed: Oct. 12, 2004

(65) Prior Publication Data

US 2005/0079736 A1  Apr. 14, 2005

(30) Foreign Application Priority Data

Oct. 14, 2003  (KR) .................. 10-2003-0071592

(51) Int. Cl.
*H01L 21/20* (2006.01)
*H01L 21/36* (2006.01)

(52) U.S. Cl.
USPC .................................. 438/487; 257/E21.134

(58) Field of Classification Search
USPC .. 438/478–481, 483, 485–491; 257/E21.412, 257/E21.134
See application file for complete search history.

(56) References Cited

U.S. PATENT DOCUMENTS

| | | | |
|---|---|---|---|
| 4,309,225 A * | 1/1982 | Fan et al. | ......................... 438/72 |
| 6,177,391 B1 | 1/2001 | Zafar | ........................... 510/131 |
| 6,322,625 B2 | 11/2001 | Im | |
| 6,555,449 B1 | 4/2003 | Im et al. | |
| 6,908,835 B2 * | 6/2005 | Sposili et al. | ................. 438/487 |
| 2002/0179001 A1 | 12/2002 | Jung | |
| 2005/0079736 A1 | 4/2005 | Park et al. | |

FOREIGN PATENT DOCUMENTS

| | | |
|---|---|---|
| CN | 1396317 | 2/2003 |
| CN | 1443364 | 9/2003 |
| JP | 2003045803 | 2/2003 |
| JP | 2003-124116 | 4/2003 |
| JP | 2003151907 | 5/2003 |
| JP | 2003282441 | 10/2003 |
| JP | 2004213027 | 7/2004 |
| KR | 1020020086047 | 11/2002 |
| KR | 2002-0093194 | 12/2002 |
| KR | 1020020093194 | 12/2002 |
| KR | 1020030017302 | 3/2003 |
| WO | 9745827 | 12/1997 |
| WO | WO 97/45827 | 12/1997 |

OTHER PUBLICATIONS

Notice of Allowance mailed Sep. 4, 2007 (from U.S. Appl. No. 10/952,718).

* cited by examiner

*Primary Examiner* — Jarrett Stark
(74) *Attorney, Agent, or Firm* — H.C. Park & Associates, PLC

(57) ABSTRACT

The present invention relates to a fabrication method for polycrystalline silicon thin that is capable of providing uniform crystallization of polycrystalline silicon thin film by laser using a mask having a mixed structure of laser transmission regions and laser non-transmission regions, wherein the laser transmission regions exist asymmetrically on the basis of a laser scanning directional axis, and the laser transmission regions exist symmetrically on the basis of a certain central axis, and the laser transmission regions are shifted to a certain distance on the basis of another axis parallel to the certain central axis, so that the laser transmission regions and non laser transmission regions are alternately positioned.

8 Claims, 11 Drawing Sheets

FABRICATION METHOD FOR POLYCRYSTALLINE SILICON THIN FILM AND DISPLAY DEVICE FABRICATED USING THE SAME

This application claims the benefit of Korean Patent Application No. 2003-71592, filed on Oct. 14, 2003, which is hereby incorporated by reference for all purposes as if fully set forth herein.

BACKGROUND OF THE INVENTION

1. Field of the invention

The present invention relates to a method for fabricating a polycrystalline silicon thin film for an apparatus and an apparatus that uses polycrystalline silicon thin film fabricated by the method, more particularly, to a method for fabricating a polycrystalline silicon thin film capable of controlling the shape of grains of polycrystalline silicon thin film and an apparatus using the polycrystalline silicon thin film.

2. Discussion of Related Art

Generally, the sequential lateral solidification (SLS) crystallizing method is used to laterally grow grain silicon by irradiating a laser beam on an amorphous silicon layer two or more times. Polycrystalline silicon grains thus fabricated are formed in a columnar shape, and grain boundaries are formed between adjacent grains due to the grains' limited size.

Polycrystalline or single crystal large silicon grains may be formed on a substrate using SLS crystallization technology, and characteristics similar to characteristics of a thin film transistor (TFT) fabricated of single crystal silicon may be obtained.

FIG. 1A, FIG. 1B and FIG. 1C show an ordinary SLS crystallizing method.

In the SLS crystallizing method as illustrated in FIG. 1A, a laser beam is irradiated onto an amorphous silicon thin film layer through a mask having a laser beam transmission region and a laser beam non-transmission region, thereby melting the amorphous silicon in the laser beam transmission region.

Crystallization preferentially occurs at an interface between amorphous silicon and molten silicon if cooling is started after finishing the laser beam irradiation, wherein a temperature gradient is formed in which temperature is gradually decreased in a direction from the interface between amorphous silicon and molten silicon to a molten silicon layer.

Therefore, referring to FIG. 1B, a polycrystalline silicon thin film layer, with laterally grown grains formed in a columnar shape, is formed since heat flux flows in a direction from the interface of the mask to a central part of the molten silicon layer. The polycrystalline silicon grains grow laterally until the molten silicon layer is completely solidified.

As illustrated in FIG. 1C, amorphous silicon and crystalline silicon are melted by moving stage, thereby moving mask, by irradiating a laser beam onto partially exposed portions of the amorphous silicon thin film layer and already crystallized polycrystalline silicon layer. Silicon atoms are adhered to already formed polycrystalline silicon grains that are covered by the mask so that the length of the grains is increased as the melted amorphous silicon and crystalline silicon cool after being melted.

FIG. 2A, FIG. 2B and FIG. 2C are plan figures that show a method for crystallizing grain silicon using a mask structure of an ordinary fabrication method of polycrystalline silicon thin film, and FIG. 3A, FIG. 3B and FIG. 3C are plan figures of polycrystalline silicon thin films produced in respective stages.

In FIG. 2A, amorphous silicon is melted by irradiating a laser beam onto the amorphous silicon using an ordinary mask with a laser beam transmission region and a laser beam non-transmission region. Polycrystalline silicon is formed as the melted amorphous silicon solidifies.

The mask is shifted as far as a certain distance illustrated in FIG. 2B, and a laser beam is irradiated onto a portion of the previously formed polycrystalline silicon and amorphous silicon as illustrated in FIG. 2C. By continuously scanning the polycrystalline silicon and irradiating a laser beam onto the polycrystalline silicon in this manner, at a part where mask patterns of the amorphous silicon and transmission region overlap with each other, polycrystalline silicon is melted and crystallized as it solidifies.

Polycrystalline silicon crystallinity varies per parts onto which a laser pulse is irradiated due to laser shot energy density deviation, or energy density in the laser beam can be uneven in amorphous silicon onto which a laser beam is once irradiated as illustrated in FIG. 3A.

Particularly, laser scan line causes striped defects on upper and lower boundaries between different laser shots as illustrated in FIG. 3B and FIG. 3C.

These striped defects cause luminance non-uniformity on a display device, particularly an organic electroluminescent device.

PCT international patent No. WO 97/45827 and U.S. Pat. No. 6,322,625, disclose technologies for converting amorphous silicon on a substrate into polycrystalline silicon, or for crystallizing only a selected region on the substrate, by the sequential lateral solidification (SLS) method.

Additionally, obtaining TFT characteristics second only to single crystal silicon is disclosed in U.S. Pat. No. 6,177,391, since the barrier effect of grain boundaries for a carrier direction is minimized when an active channel direction is parallel to a direction of grains grown by SLS crystallizing method. But the patent also discloses that large numbers of the grain boundaries act as a trap of charge carriers, and TFT characteristics greatly deteriorate when the active channel direction is perpendicular to the grain growing direction.

There is a case, however, where an active matrix display device is fabricated with driving circuit TFTs generally perpendicular to pixel cell region TFTs, wherein uniformity of the display device is improved when an active channel region direction is inclined 30 to 60 degrees to a crystal growing direction.

However, with this method, since the grains are formed by the SLS crystallizing method, the problem of non-uniform grains due to non-uniformity of laser energy density still exists.

Also with this method, crystallization can not be carried out all over a substrate, therefore an uncrystallized region will always exist, although a method is described in Korean Patent Laid-open Publication No. 2002-93194 in which laser beam patterns are formed in a triangle shape ("◁"), and crystallization is proceeded by moving the triangle shaped ("◁") laser beam patterns widthwise.

SUMMARY OF THE INVENTION

Accordingly, the present invention is directed to a fabrication method for polycrystalline silicon thin film and an apparatus using the same that substantially obviates one or more of the problems due to limitations and disadvantages of the related art.

This invention provides a method for improving uniformity of polycrystalline silicon thin film fabricated by the SLS crystallizing method.

This present invention also provides an apparatus using polycrystalline silicon thin film fabricated by the method above.

Additional features of the invention will be set forth in the description which follows, and in part will be apparent from the description, or may be learned by practice of the invention.

The present invention discloses a method of fabricating a polycrystalline silicon thin film in which amorphous silicon is crystallized by laser, comprising forming a mask having a laser transmission region and a laser non-transmission region, and shifting the laser transmission region a distance on the basis of an axis parallel to a predetermined central axis. The laser transmission region exists asymmetrically on the basis of a laser scanning directional axis, and the laser transmission region exists symmetrically on the basis of a predetermined central axis. The laser transmission region and the laser non-transmission region are alternately positioned. The predetermined central axis is x and/or y.

This present invention also discloses a display device using a polycrystalline silicon thin film fabricated by the process of forming a mask having a laser transmission region and a laser non-transmission region, and shifting the laser transmission region a distance on the basis of an axis parallel to a predetermined central axis. The predetermined central axis is x and/or y. The laser transmission region exists asymmetrically on the basis of a laser scanning directional axis, and the laser transmission region exists symmetrically on the basis of a predetermined central axis. The predetermined central axis is x and/or y. The laser transmission region and the laser non-transmission region are alternately positioned.

This present invention also discloses a mask used for fabricating polycrystalline silicon thin film, comprising a laser transmission region and a laser non-transmission region. The laser transmission region exists asymmetrically on the basis of a laser scanning directional axis and the laser transmission region exists symmetrically on the basis of a predetermined central axis. The predetermined central axis is x and/or y.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE INVENTION

Figure 1A:
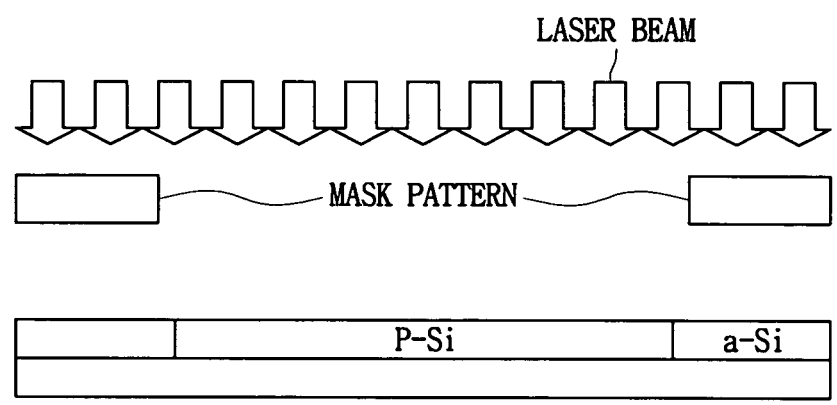
FIG. 1A, FIG. 1B and FIG. 1C show an ordinary sequential lateral solidification (SLS) crystallization method.
Figure 1B:
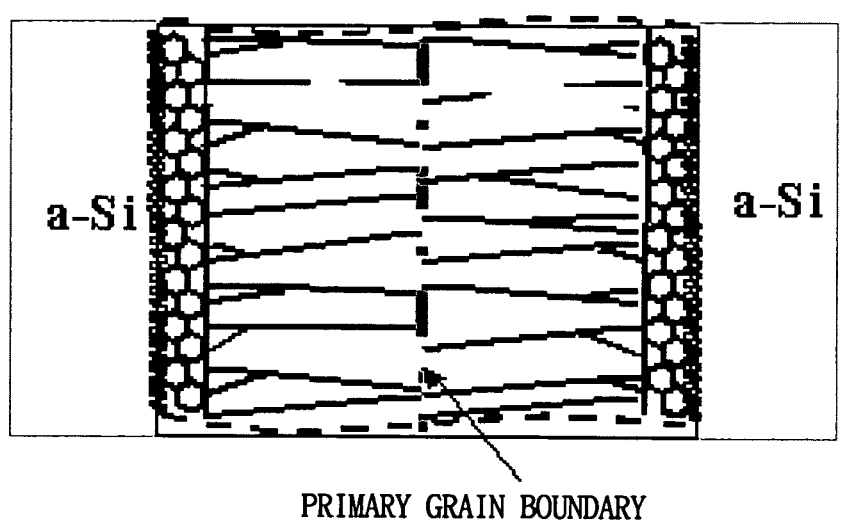
Figure 1C:
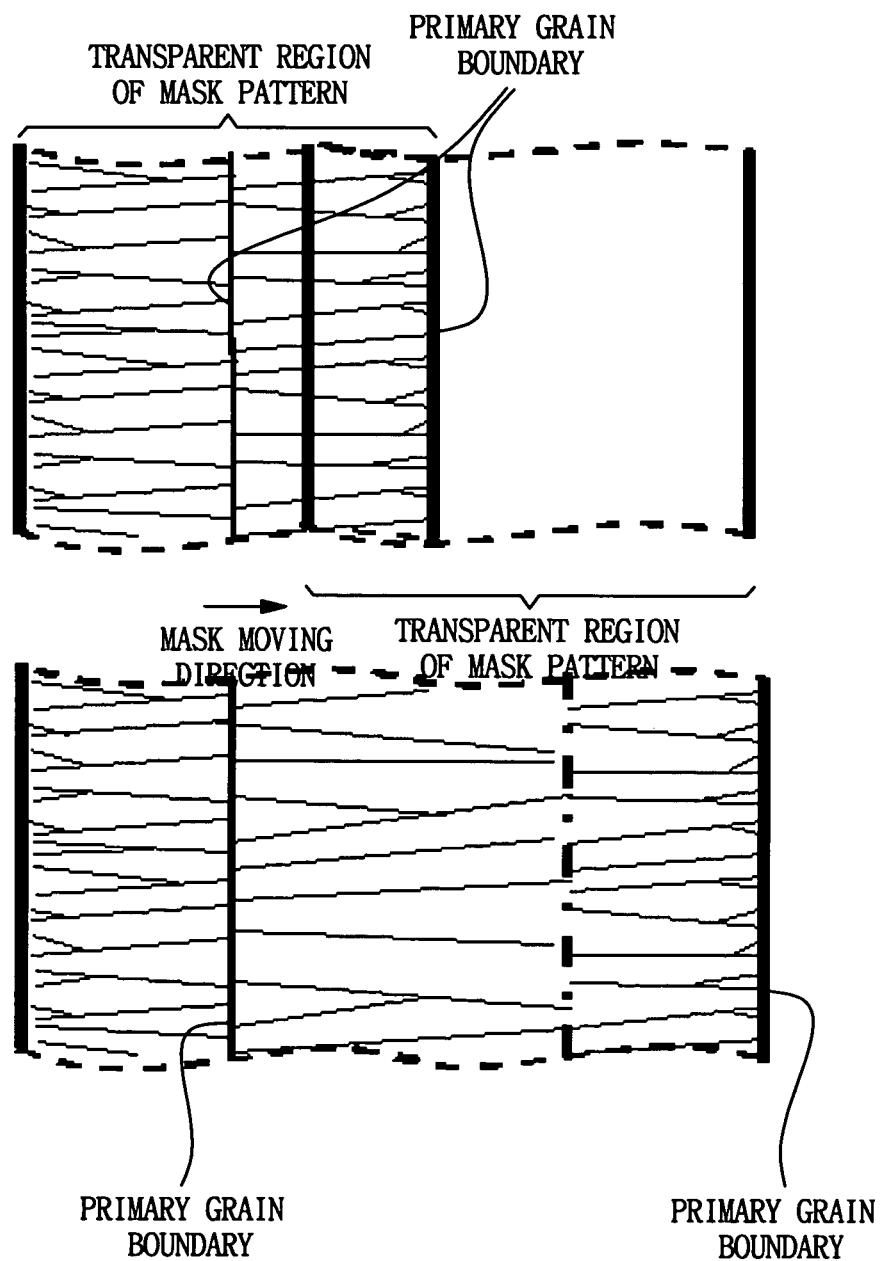
Figure 2A:
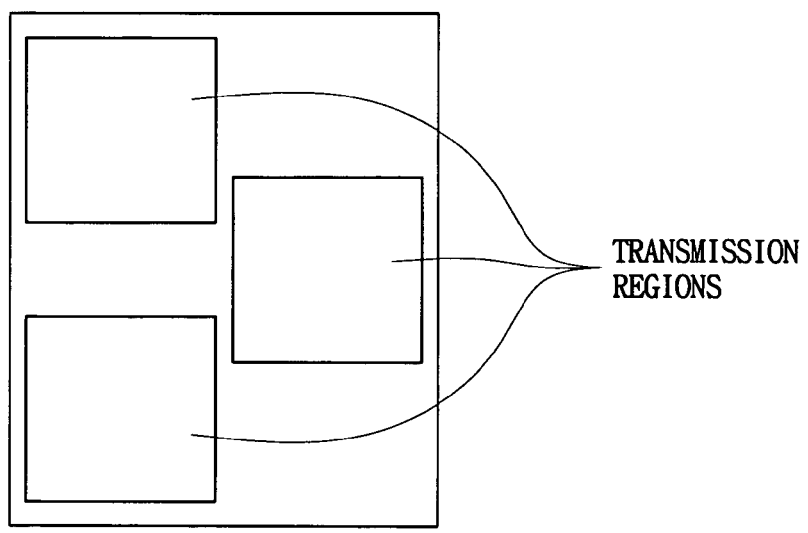
FIG. 2A, FIG. 2B and FIG. 2C are plan figures that show a method for crystallizing grain silicon using a mask structure of an ordinary fabrication method of polycrystalline silicon thin film.
Figure 2B:
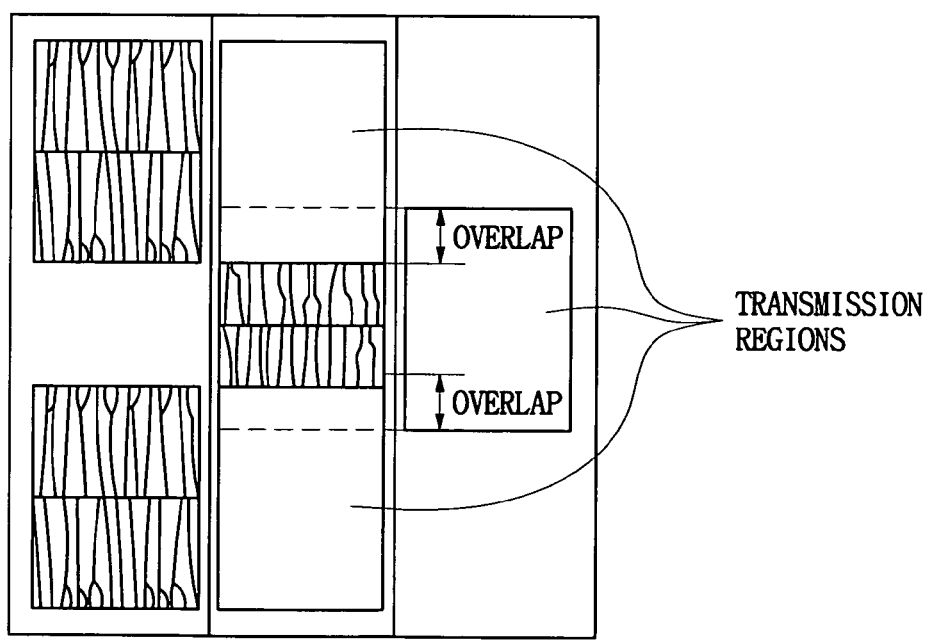
Figure 2C:
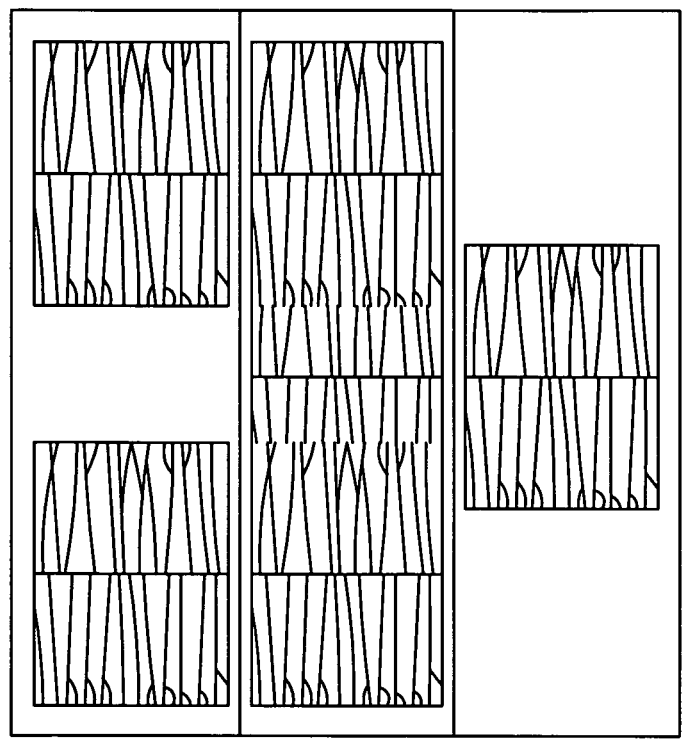

Reference will now be made in detail to an embodiment of the present invention, example of which is illustrated in the accompanying drawings.

For reference, like reference characters designate corresponding parts throughout several views.

Figure 4A:
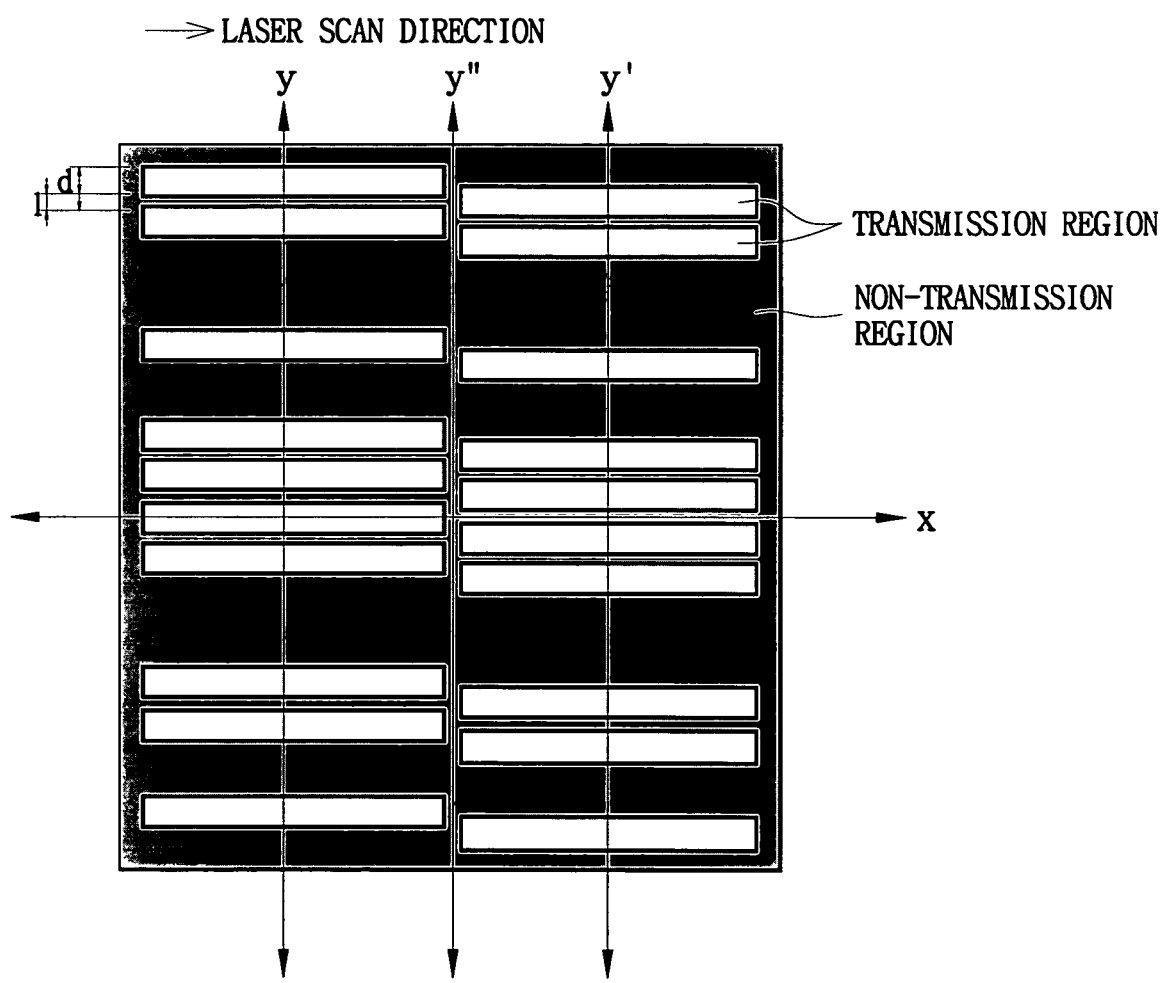
FIG. 4A is a plan figure that shows a case when a laser is once irradiated onto line shaped transmission patterns.
Figure 4B:
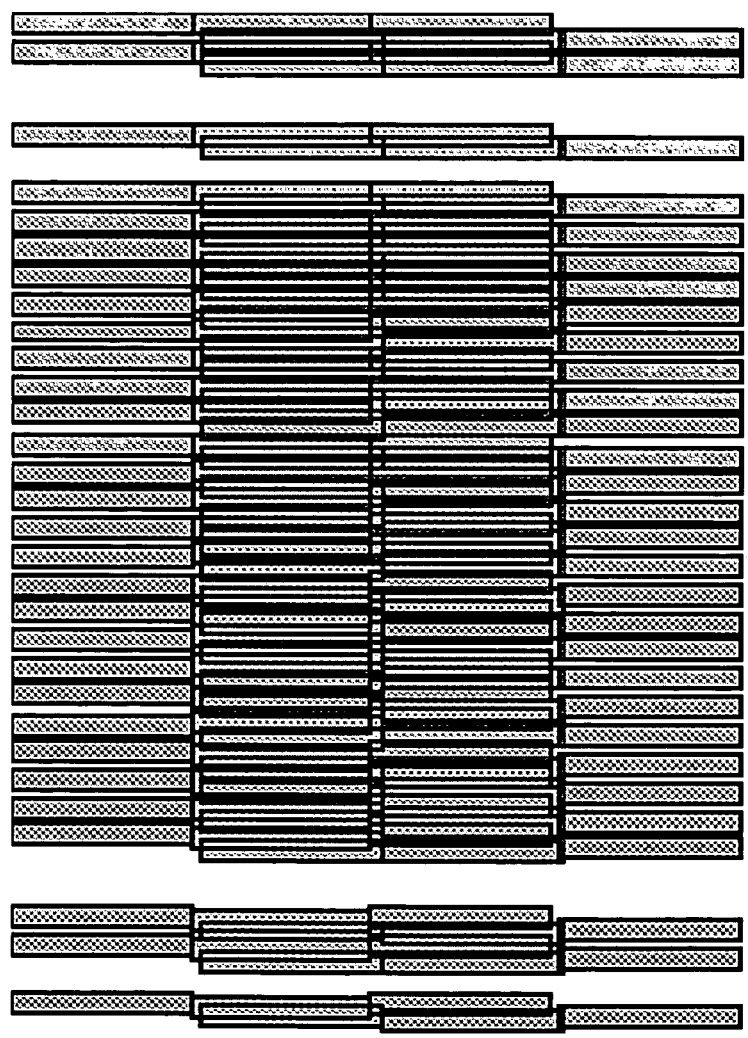
FIG. 4B is a plan figure that shows a case when a laser is irradiated onto the line shaped transmission patterns twice by moving the mask patterns to a certain distance.

FIG. 4A and FIG. 4B are plan figures showing mask patterns and scanning according to a first exemplary embodiment of the present invention. FIG. 4A shows a case when a laser is once irradiated onto line shaped transmission patterns. FIG. 4B shows a case when a laser is irradiated onto the line shaped transmission patterns twice by moving the mask patterns to a certain distance Referring to FIG. 4A, transmission pattern groups have transmission regions formed in upper and lower mask patterns. The transmission regions are asymmetrical to each other based on an x axis, which is a directional axis parallel to a scan direction, and the transmission regions are symmetrical to each other based on axes y, y', which are perpendicular to the x axis.

The mask patterns are shifted to a certain distance based on another axis that is parallel to the certain central axis so that transmission regions and non-transmission regions are reversed when the mask is moved after once irradiating the laser on the mask patterns formed as described above.

That is, a part of the transmission region before moving the mask and a part of the transmission region after moving the mask overlap as illustrated in FIG. 4B, wherein a part of the transmission region is shifted to be formed on a non-transmission region while a part of the non-transmission region is shifted to be formed on the transmission region.

Figure 3A:
FIG. 3A, FIG. 3B and FIG. 3C are plan figures that show polycrystalline silicon thin film produced in each stage of FIG. 2A, FIG. 2B and FIG. 2C.
Figure 3B:
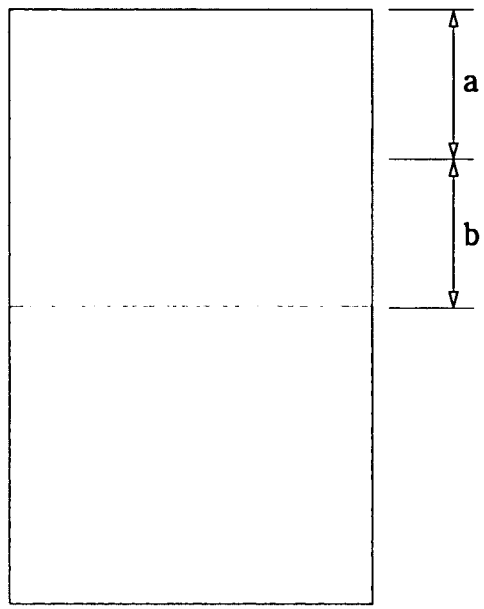
Figure 3C:
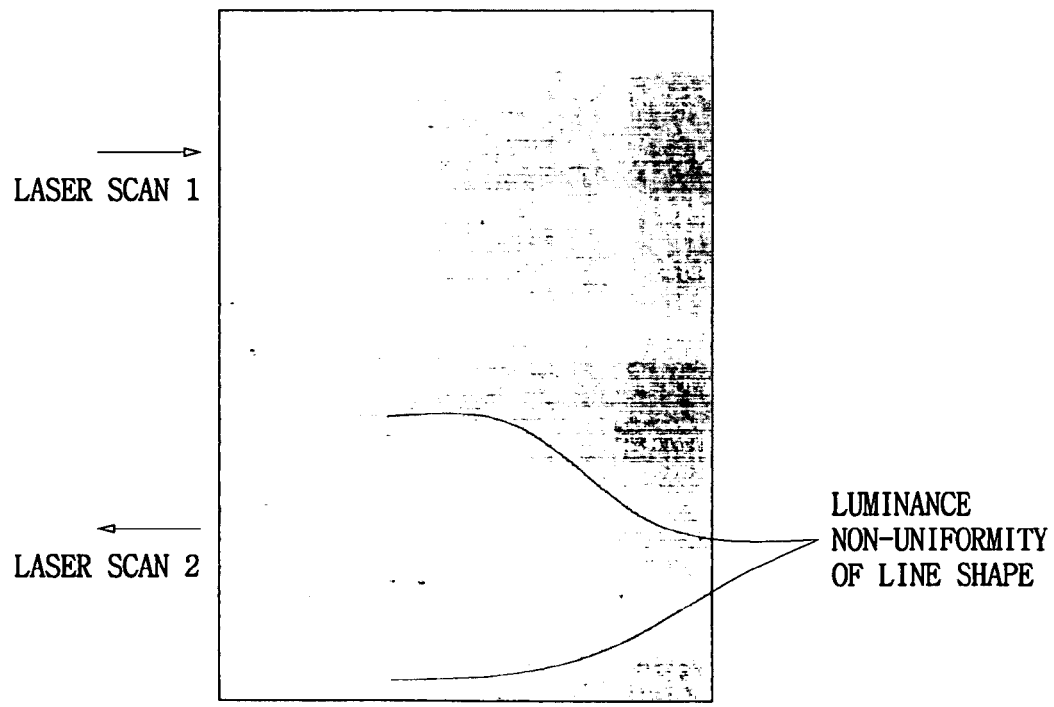

Therefore, the same grains are formed on the region b as on the region a since the region b is crystallized a second time using the same energy as a laser energy irradiated a region a by crystallizing the melted grains after melting grains of the region b using laser after moving mask although grains are vertically differently formed in case that laser is irradiated on mask patterns once according to energy deviation of laser irradiated as illustrated in FIG. 3B. Eventually, the same effect as that transmission region is moved as much as a distance of d–I of FIG. 4A is generated, where the distance d–I is obtained by subtracting I, the shortest distance in width of a non-transmission region between transmission regions, from a distance d, where d is greater than I.

The mask moves along the scan directional axis as much as ¼ of width of the mask based on a y" axis.

Therefore, a polycrystalline silicon thin film is formed in such a way that grains may be formed evenly.

Although FIG. 4A illustrates line shaped transmission regions, transmission regions are not limited to the line shaped pattern.

Figure 5A:
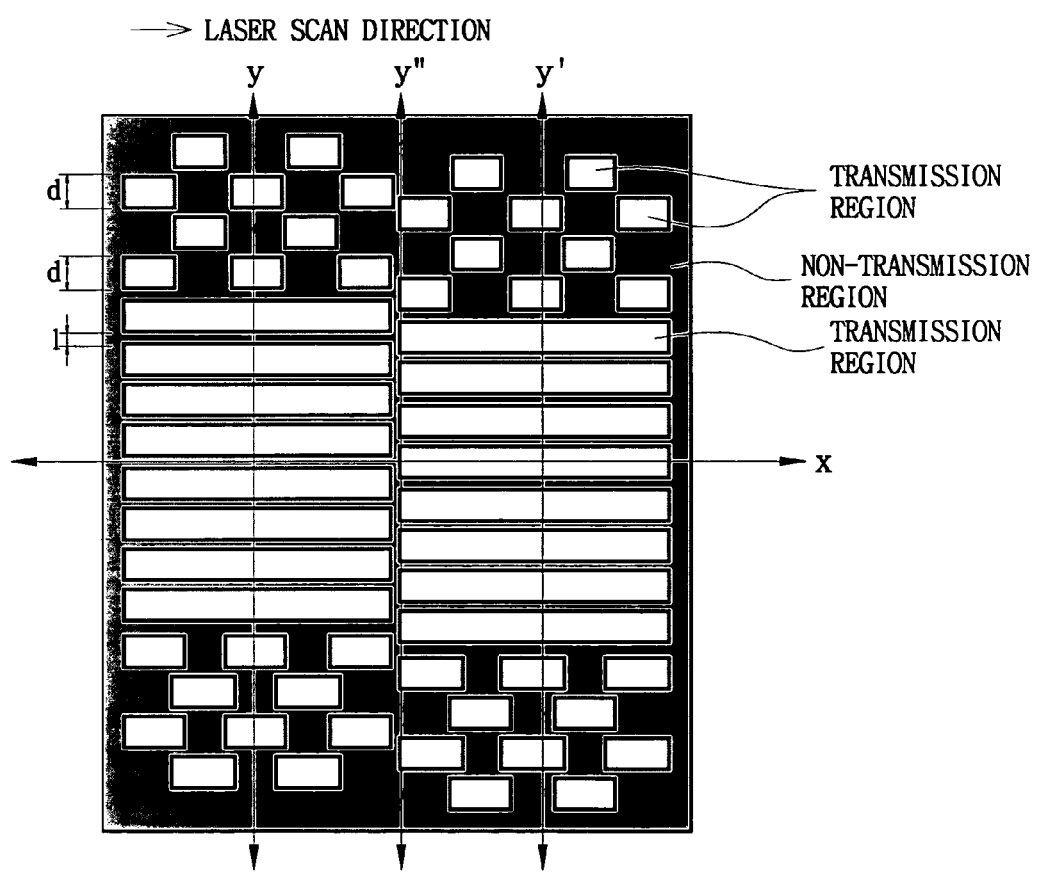
FIG. 5A is a plan figure that shows a case when a laser is once irradiated onto two line shaped transmission patterns of a different length.
Figure 5B:
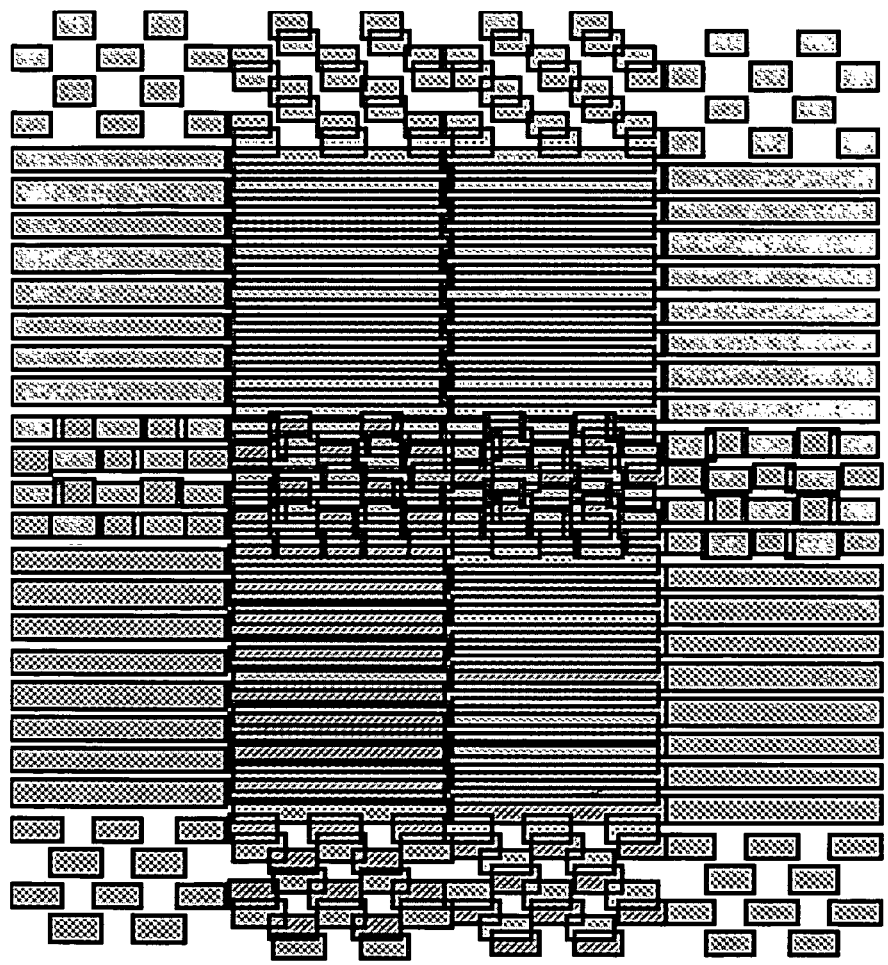
FIG. 5B is a plan figure that shows a case when a laser is irradiated onto the differing length line shaped transmission patterns twice by moving the mask patterns to a certain distance.

FIG. 5A and FIG. 5B are plan figures showing mask patterns and scanning according to a second exemplary embodiment of the present invention. FIG. 5A shows a case when a laser is once irradiated onto three line shaped transmission patterns of a different length, and FIG. 5B shows a case when a laser is irradiated onto the differing length line shaped transmission patterns twice by moving the mask patterns to a certain distance.

Referring to FIG. 5A and FIG. 5B, mask patterns of the second exemplary embodiment of the present invention have a structure with first line shaped transmission regions, second line shaped transmission regions, and third line shaped transmission regions where the second line shaped transmission regions have a shorter length than the first line shaped transmission regions, and the third line shaped transmission regions have a shorter length than the second line shaped transmission regions.

The mask patterns also exist in such a way that transmission regions are asymmetrical to each other based on an x axis, which is an axis parallel to a scan line direction, and the transmission regions are symmetrical to each other based on axes y, y', which are perpendicular to the x axis.

The mask patterns are shifted to a certain distance based on another axis that is parallel to the certain central axis so that transmission regions and non-transmission regions are reversed when the mask is moved after once irradiating the laser on the mask patterns formed as described above.

That is, a part of the transmission region before moving the mask and a part of the transmission region after moving the mask overlap as illustrated in FIG. 5B, wherein a part of the transmission region is shifted to be formed on a non-transmission region while a part of the non-transmission region is shifted to be formed on the transmission region.

Therefore, the same grains are formed on the region b as on the region a since the region b is crystallized a second time using the same energy as a laser energy irradiated a region a by crystallizing the melted grains after melting grains of the region b using laser after moving mask although grains are vertically differently formed in case that laser is irradiated on mask patterns once according to energy deviation of laser irradiated as illustrated in FIG. 3B. Eventually, the same effect as that transmission region is moved as much as a distance of d–I of FIG. 5A is generated.

Figure 6A:
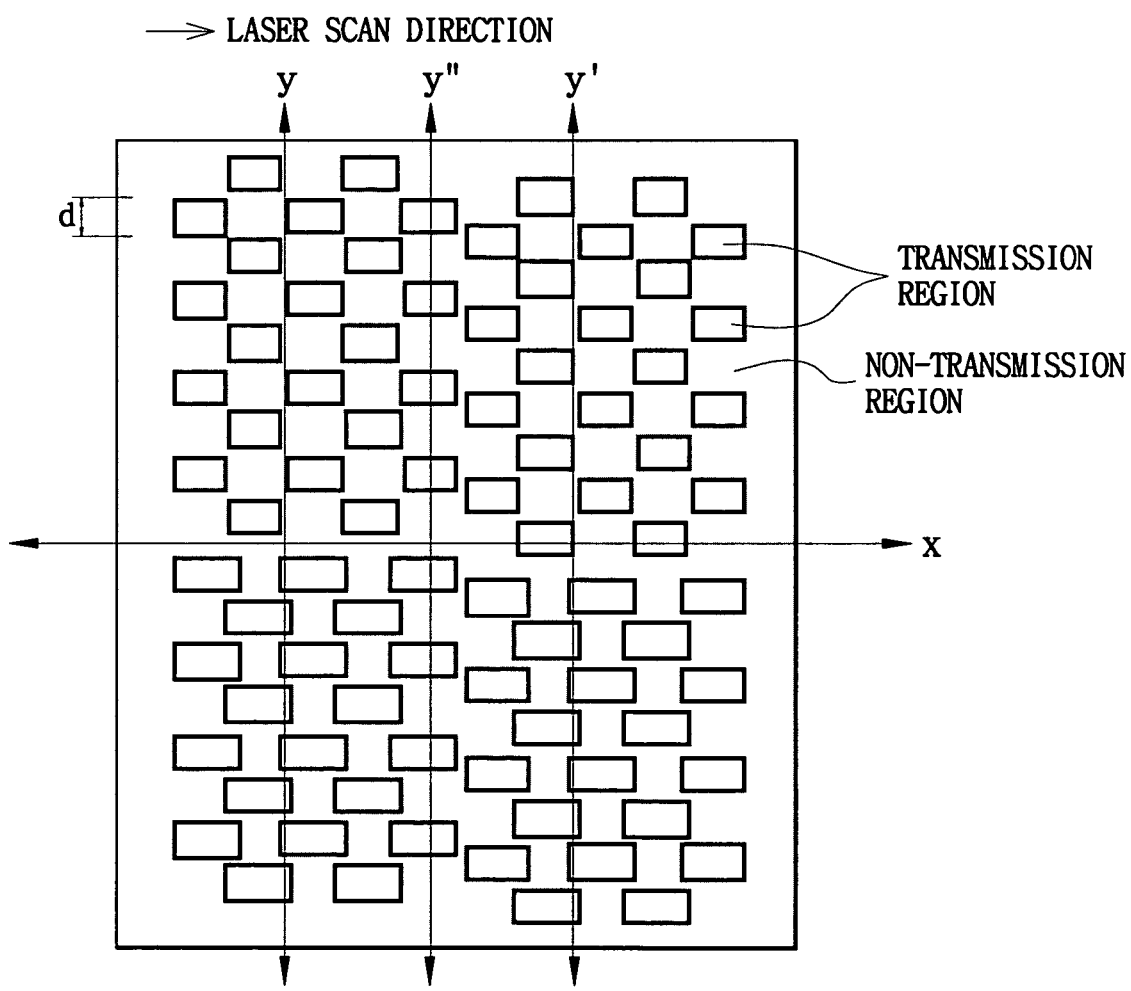
FIG. 6A is a plan figure that shows a case when a laser is once irradiated onto two line shaped transmission patterns where the patterns are of differing length but shorter than the length of the transmission pattern of the first embodiment.
Figure 6B:
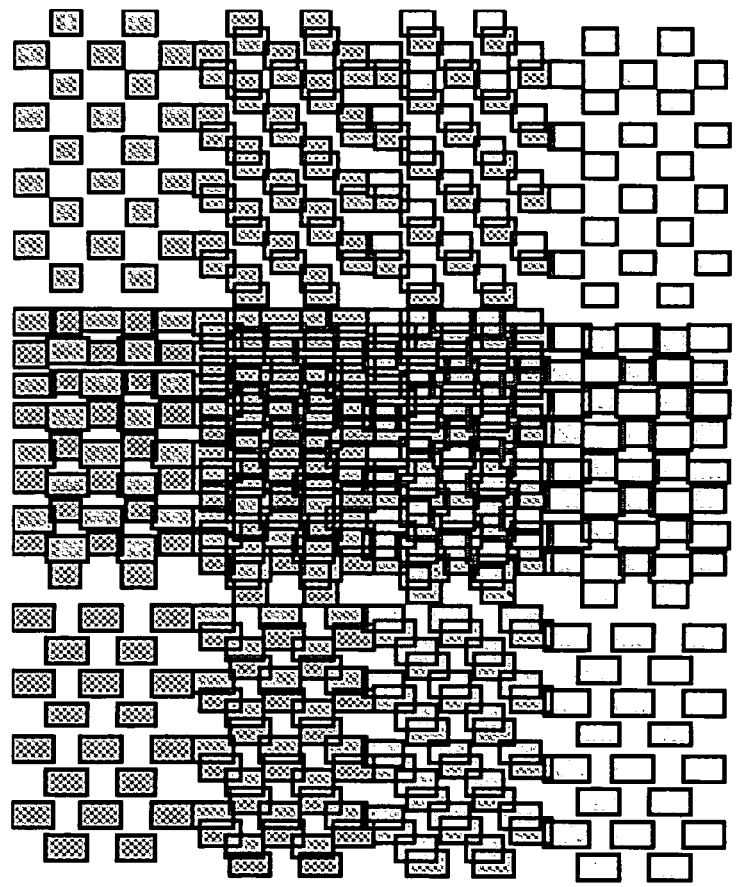
FIG. 6B is a plan figure that shows a case when a laser is irradiated onto the differing length line shaped transmission patterns twice by moving the mask patterns to a certain distance.

FIG. 6A and FIG. 6B are plan figures showing mask patterns and scanning according to a third exemplary embodiment of the present invention. FIG. 6A shows a case when a laser is once irradiated onto two line shaped transmission patterns where the patterns are of differing length but shorter than the length of the transmission pattern of the first embodiment. FIG. 6B shows a case when a laser is irradiated onto the differing length line shaped transmission patterns twice by moving the mask patterns to a certain distance.

The mask patterns also exist in such a way that transmission regions are asymmetrical to each other based on an x axis, which is an axis parallel to a scan line direction, and the transmission regions are symmetrical to each other based on axes y, y', which are perpendicular to the x axis.

The transmission patterns are shifted to a certain distance based on another axis that is parallel to the certain central axis so that transmission regions and non-transmission regions are reversed when the mask is moved after once irradiating the laser on the mask patterns formed as described above.

That is, a part of the transmission region before moving the mask and a part of the transmission region after moving the mask overlap as illustrated in FIG. 6B, wherein a part of the transmission region is shifted to be formed on a non-transmission region while a part of the non-transmission region is shifted to be formed on the transmission region.

Therefore, the same grains are formed on the region b as on the region a since the region b is crystallized a second time using the same energy as a laser energy irradiated a region a by crystallizing the melted grains after melting grains of the region b using laser after moving mask although grains are vertically differently formed in case that laser is irradiated on mask patterns once according to energy deviation of laser irradiated as illustrated in FIG. 3B.

As described in the above, non-uniformed crystallization of polycrystalline silicon according due to laser energy deviation during crystallization may be prevented by designing mask patterns as described in exemplary embodiments of the present invention.

A display device used in the present invention is preferably a flat panel display device such as liquid crystal display device or organic electroluminescent device.

As described in the above, the present invention may be capable of solving luminance non-uniformity of a display device by forming mask patterns so that non-uniformity of crystallization of polycrystalline silicon according to laser deviation is overcome.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method for fabricating a polycrystalline silicon thin film out of amorphous silicon using laser, comprising:

placing a mask having mask patterns forming laser transmission regions and laser non-transmission regions on a semiconductor layer;

scanning a first laser beam through the mask onto a first area of the semiconductor layer, while a relative position of the mask with respect to the semiconductor layer is fixed at a first location;

shifting the mask from the first location to a second location, on the basis of an axis parallel to a predetermined central axis and without radiating a laser beam onto the semiconductor layer after radiating the first laser beam; and scanning a second laser beam through the shifted mask and across a second area of the semiconductor layer, while the relative position of the mask with respect to the semiconductor layer is fixed at the second location, wherein the laser transmission regions exist asymmetrically on the basis of a laser scanning directional axis, and the laser transmission regions exist symmetrically on the basis of a predetermined central axis, wherein the laser transmission regions and the laser non-transmission regions are alternately positioned, wherein a laser transmission region has a structure in which laser transmission regions partially overlap in a direction perpendicular to the laser scanning directional axis when the mask is shifted the distance based on the axis parallel to the predetermined central axis, wherein a distance of the overlap between laser transmission regions is shorter than a width of the laser transmission region in a direction perpendicular to the laser scanning directional axis, wherein at least one laser transmission region is spaced apart by a different distance from the two other adjacent transmission regions disposed in a direction perpendicular to the laser scanning directional axis, the at least one laser transmission region is disposed between the two other adjacent transmission regions, and the at least one laser transmission region and the two other adjacent transmission regions are three successive laser transmission regions, wherein the laser transmission regions comprise a first laser transmission region of a line shaped pattern, a second laser transmission region of a line shaped pattern, and a third laser transmission region of a line shaped pattern, and wherein the length of the third laser transmission region is greater than the sum of the length of the first laser transmission region and the length of the second laser transmission region.

2. The method of claim 1, wherein the laser transmission regions are congruent, line shaped regions.

3. The method of claim 1, wherein the axis parallel to the predetermined central axis is positioned at a center of the mask, and the distance the masked is shifted is as much as ¼ of a width of the mask based on the axis parallel to the predetermined central axis.

4. The method of claim 1, wherein the predetermined central axis is perpendicular to the laser scanning directional axis.

5. The method of claim 1, wherein the axis parallel to the predetermined central axis is perpendicular to the laser scanning directional axis and positioned at a center of the mask.

6. The method of claim 1, wherein the laser transmission regions exist asymmetrically on the basis of an y axis.

7. A method for fabricating a polycrystalline silicon thin film using a laser through a mask, comprising:

forming a first polycrystalline silicon region on a substrate while a relative position of the mask with respect to the substrate is fixed at a first location, by scanning a laser beam across the first polycrystalline region, the first polycrystalline silicon region comprising first areas, the first areas being asymmetrical to each other on the basis of a laser scanning directional axis and being symmetrical to each other on the basis of a central axis of the first polycrystalline silicon region that is perpendicular to the laser scanning directional axis, and three successive first areas comprise a middle first area of the three successive first areas that is spaced apart by different distances from the other two first areas of the three successive first areas, the three successive first areas being disposed in a direction perpendicular to the laser scanning directional axis;

shifting a mask from the first location to a second location in the scanning direction without radiating a laser beam onto the substrate; and forming a second polycrystalline silicon region on the substrate while the relative position of the mask with respect to the substrate is fixed at second location, by scanning a laser beam across the second polycrystalline silicon region, the second polycrystalline silicon region comprising second areas, the second areas being asymmetrical to each other on the basis of the laser scanning directional axis and being symmetrical to each other on the basis of a central axis of the second polycrystalline silicon region that is perpendicular to the laser scanning directional axis, and three successive second areas comprise a middle second area of the three successive second areas that is spaced apart by different distances from the other two second areas of the three successive second areas, the three successive second areas being disposed in the direction perpendicular to the laser scanning directional axis, wherein the second areas partially overlap the first areas in the direction perpendicular to the laser scanning directional axis, a distance of the overlap between the second areas and the first areas is shorter than a width of one second area in the direction perpendicular to the laser scanning directional axis, wherein the first areas comprise:
a first, first area of a line shaped pattern,
a second, first area of a line shaped pattern, and
a third, first area of a line shaped pattern, wherein the length of the third, first area is greater than the sum of the length of the first, first area and the length of the second, first area, wherein the second areas comprise:
a first, second area of a line shaped pattern,
a second, second area of a line shaped pattern, and
a third, second area of a line shaped pattern, and wherein the length of the third, second area is greater than the sum of the length of the first, second area and the length of the second, second area.

8. The method of claim 7, wherein the first areas and the second areas are congruent, line shaped areas.

* * * * *